US008150351B2

(12) United States Patent  
Shah et al.

(10) Patent No.: US 8,150,351 B2  
(45) Date of Patent: Apr. 3, 2012

(54) RECEIVER WITH TUNER FRONT END USING TRACKING FILTERS AND CALIBRATION

(75) Inventors: Peter Shah, San Diego, CA (US); Bert Fransis, Hasselt (BE); Keith Bargroff, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 722 days.

(21) Appl. No.: 12/297,175

(22) PCT Filed: Apr. 16, 2007

(86) PCT No.: PCT/US2007/066724
§ 371 (c)(1), (2), (4) Date: Oct. 22, 2008

(87) PCT Pub. No.: WO2007/121407
PCT Pub. Date: Oct. 25, 2007

(65) Prior Publication Data
US 2010/0156575 A1 Jun. 24, 2010

Related U.S. Application Data

(60) Provisional application No. 60/792,539, filed on Apr. 17, 2006, provisional application No. 60/792,593, filed on Apr. 17, 2006.

(51) Int. Cl.
*H03J 3/08* (2006.01)

(52) U.S. Cl. ............... 455/226.1; 455/226.3; 455/230
(58) Field of Classification Search ............. 455/226.1
See application file for complete search history.

(56) References Cited

U.S. PATENT DOCUMENTS

| | | | | |
|---|---|---|---|---|
| 6,307,442 | B1 * | 10/2001 | Meyer et al. ............. | 333/17.1 |
| 7,336,939 | B2 * | 2/2008 | Gomez ..................... | 455/307 |
| 2004/0235445 | A1 * | 11/2004 | Gomez ..................... | 455/307 |
| 2006/0072276 | A1 * | 4/2006 | Ruitenburg ............... | 361/113 |
| 2006/0154636 | A1 * | 7/2006 | Shah et al. ............... | 455/290 |
| 2006/0287009 | A1 * | 12/2006 | Arad ....................... | 455/574 |

* cited by examiner

*Primary Examiner* — Ryan Jager
(74) *Attorney, Agent, or Firm* — Bruce W. Greenhaus

(57) ABSTRACT

A broadband tuner includes a tracking filter with calibration to compensate for component errors and drift. The filters use off-die inductors that are preferably within a system-in-package (SIP) with other critical tuner components, which produces a highly integrated tuner front end with high Q filters within a single package. High voltage varactors with a large tuning range can be used for variable capacitors. The integration of the tuner into a SIP allows the tuner design to be optimized for cost and performance while keeping the critical RF layout requirements within the tuner. A configurable tuner front end enables modes for low noise, high linearity, good input return loss (S11) across the entire RF band, and applying a test tone in the calibration mode. The switchable mode enables the tuner to be effective during weak terrestrial reception, strong terrestrial reception, and connection to a cable plant.

31 Claims, 11 Drawing Sheets

RECEIVER WITH TUNER FRONT END USING TRACKING FILTERS AND CALIBRATION

RELATED APPLICATIONS

This application claims priority from U.S. provisional application No. 60/792,539 filed Apr. 17, 2006 entitled "Receiver system with adjustable selectivity", and U.S. provisional application No. 60/792,593 filed Apr. 17, 2006 entitled "Multi-mode low noise amplifier", each incorporated herein by reference.

BACKGROUND

1. Field of Invention

The present invention relates to communication systems and more specifically to an architecture and tracking filters for use in a broadband tuner.

2. Prior Art

Tuners are used for both terrestrial and cable reception within TVs, VCRs, DVD recorders, set-top-boxes, FM radios, modems and other similar consumer devices. The tuner selects a narrowband signal from within a wide- or broad-band signal comprising many channels. The tuner comprises a combination of band pass filtering and frequency down conversion. One known tuner architecture employs a tunable band pass filter, also called a tracking filter, on the input signal, followed by frequency down conversion, and additional filtering at a fixed frequency. The tunable band pass filter restricts the range of frequencies that are amplified and down converted to relax the requirement of the amplifiers and to improve the rejection of unwanted channels, noise, and interference. For broadband tuner applications, the most common solution today is the can-tuner. This is typically a combination of one or two monolithic ICs and several hundred discrete components housed in a metal can.

Frequency tuning and down converting methods often use relatively high-voltage (for example 30 volts) high capacitance ratio varactors (also called varactor diodes or variable capacitance diodes) as tuning elements in filters. A disadvantage of this approach is that this conventional method is not compatible with low voltage semiconductor processes such as CMOS and results in the varactors residing off-die and a separate power supply is often required. This increases cost and space usage.

Prior art usage of on-die varactors use low voltage varactors integrated on-die and operating at the power supply rails, for example, 3 volts for CMOS. The capacitance ratio is typically 2:1 which results in a limited tuning range. Discrete off-die high voltage varactors operating at 30 volts provide for a higher capacitance ratio, for example, 10:1, and if required, can maintain a high Q over this tuning range. These varactors are known, commonly found as single or back-to-back connection of two diodes in a 3-terminal package, but do not have other passive or active components integrated together. Typically in a can-tuner, temperature and aging changes in these varactors are compensated for by the means of using (sharing) the same voltage as the one used on the varactor in the PLL. This voltage tracks the changes of the varactor in the PLL because the PLL is locked to a stable frequency reference and maintains the frequency by correcting the varactor voltage. As the varactors are discrete, they are poorly matched and so the compensation is degraded. Also because the tracking filter is operated at a different frequency to the PLL, the compensation is further degraded in the can-tuner.

Prior art use of tracking filters in can-tuners provide attenuation to large jammer signals thereby significantly reducing the linearity requirements of the front end of the tuner. By reducing the linearity requirements power consumption can be significantly reduced. This filtering also reduces the requirements of the oscillator phase noise by attenuating the unwanted signals interference effects due to reciprocal mixing. Also these can-tuners typically include a tracking notch filter to attenuate the image signal, which increases complexity and cost.

Due to component tolerances, which may have initial component errors or drift errors varying with time and temperature, the center frequency of a filter will have error. Prior art tracking filters use a filter pass band response that is flat over a frequency range wider than the desired channel bandwidth to avoid rejecting portions of the desired signal if the center frequency is in error. The wide flat response requires higher complexity filters with many components.

Prior art in this field includes the following patents and publications:

U.S. Patent Application Publication US 2003/0207672 published Nov. 6, 2003 by Dang and Egan entitled "Wideband Tuning Circuit for Low-Voltage Silicon Process and Method for Generating a Tuning Frequency", incorporated herein by reference, describes a wideband tuning circuit suitable for low-voltage silicon process and includes a plurality of frequency band modules for generating a frequency within a particular frequency band of the tuning range.

U.S. Pat. No. 6,865,381, issued Mar. 8, 2005 to Vorenkamp, et al, entitled "System and Method for On-chip Filter Tuning", incorporated herein by reference, describes an integrated receiver with channel selection and image rejection substantially implemented on a single CMOS integrated circuit that uses a varactor in parallel with switched capacitors to tune a VCO frequency and switched capacitors to tune filters.

U.S. Pat. No. 6,823,292, issued Nov. 23, 2004 to Spencer, entitled "Tuneable Filter", incorporated herein by reference, describes a tunable filter that uses a single varactor in parallel with switched capacitors.

U.S. Pat. No. 5,280,638, issued Jan. 18, 1994 to Porambo, et al, entitled "RF Filter Self-alignment for Multiband Radio Receiver", incorporated herein by reference, describes a variable frequency RF passband filter that is aligned or calibrated using reference frequencies obtained from a fixed frequency oscillator present in a different band tuning section of a multiband receiver.

U.S. Pat. No. 6,521,939, issued Feb. 18, 2003 to Yeo, et al, entitled "High Performance Integrated Varactor on Silicon", incorporated herein by reference, describes a new MOS varactor device.

U.S. Pat. No. 6,933,789, issued Aug. 23, 2005 to Molnar, et al, entitled "On-Chip VCO Calibration", incorporated herein by reference, provides techniques for calibrating voltage-controlled oscillators (VCOs).

U.S. Pat. No. 6,778,023, issued Aug. 17, 2004 to Christensen, entitled "Tunable Filter and Method of Tuning a Filter", incorporated herein by reference, describes a bandpass filter that is tuned by converting the filter into an oscillator using a negative resistance circuit.

U.S. Patent Application Publication US 2005/0030108 published Feb. 10, 2005 by Duncan, et al, entitled "Integrated VCO having an Improved Tuning Range over Process and Temperature Variations", incorporated herein by reference, describes an integrated VCO with improved tuning range.

U.S. Patent Application Publication US 2004/0184216 published Sep. 23, 2004 by Kurosawa, et al, entitled "Voltage Controlled Variable Capacitance Device", incorporated herein by reference, describes a varactor element having an N well formed on a P type substrate.

U.S. Pat. No. 5,311,158, issued May 10, 1994 to Asbeck, et al, entitled "High Power Tuning Device Using Layered Varactors", incorporated herein by reference, describes a matrix assembly of discrete varactors.

U.S. Pat. No. 6,307,442, issued Oct. 23, 2001 to Meyer, et al, entitled "Enhanced LC Filter with Tunable Q", incorporated herein by reference, describes a tunable filter circuit with a feedback control circuit to tune the variable resistor in order to calibrate a quality factor of the circuit.

U.S. Pat. No. 6,885,263, issued Apr. 26, 2005 to Toncich, entitled "Tunable Ferro-Electric Filter", incorporated herein by reference, describes an invention that quantifies and reduces losses in tunable bandpass filters having ferro-electric capacitors.

U.S. Pat. No. 6,714,776, issued Mar. 30, 2004 to Birleson, entitled "System and Method for an Image Rejecting Single Conversion Tuner with Phase Error Correction", incorporated herein by reference, describes a tuner system that uses phase shifted in-phase and quadrature-phase signal paths as an image rejection circuit.

U.S. Pat. No. 6,731,712, issued May 4, 2004 to Lindstrom, et al, entitled "Fully Integrated Broadband Tuner", incorporated herein by reference, describes a fully integrated single-loop frequency synthesizer.

Publication by Mujahed, entitled "High Voltage GaN Variable Capacitance Diode", incorporated herein by reference, describes a GaN varactor diode capable of 4:1 capacitance tuning ratio in the bias range of 100 to 250 volts.

Publication by Tilmans, et al, entitled "MEMS for wireless communications: 'from RF-MEMS components to RF-MEMS-SiP'" in the Journal of Micromechanics and Microengineering, Issue 4, July 2003, incorporated herein by reference, describes the progress in RF-MEMS.

Publication by Nath, et al, entitled "An Electronically-Tunable Microstrip Bandpass Filter Using Thin-Film Barium Strontium Titanate (BST) Varactors", incorporated herein by reference, describes a tunable third-order combine bandpass filter using thin-film BST varactors.

U.S. Pat. No. 6,307,442 to Meyer et al., issued Oct. 23, 2001, entitled "Enhanced LC filter with tunable Q", incorporated herein by reference, describes a tunable electronic filter circuit that tunes a variable capacitor and variable resistor to set a center frequency and quality factor.

A system-in-package (SIP) is typically made up of a substrate that carries one or more layers of patterned metal for interconnection, one or more monolithic integrated circuit (IC) die connected with either wire-bonding or flip-chip-balls and one or more discrete components, such as resistors, capacitors, inductors, diodes, transistors, and other components. The discrete components can be surface-mount devices, wire-bonded devices or components fabricated directly on the substrate.

To save space and cost, a monolithic or near-monolithic approach to a tuner with a single, readily available power supply is desirable. The need exists for a tuner that is low cost, has good selectivity, has high linearity, is adaptable to varying signal input conditions, and is insensitive to component value errors and drift.

SUMMARY OF INVENTION

A broadband tuner according to the present invention includes a tracking filter with calibration to compensate for component errors and drift, and a multi-mode low noise amplifier. The tracking filters utilize on-die variable capacitors, for example high voltage varactors, and at least one off-die inductor. Alternatively, the capacitors can be off-die. The off-die inductors can be lumped or distributed elements. These off-die inductors are preferably within a system-in-package (SIP). Alternatively, the off-die inductors can be on a printed circuit board (PCB). The high voltage varactors are effectively voltage-controlled capacitors which have a larger tuning range compared with the tuning range of low voltage varactors. Alternatively, the variable capacitors can be switched capacitors, which can be combined with a varactor. The inventions allows for a highly integrated tuner front end with high Q filters within a single package. The circuits and methods of the present invention are useful for high Q filters as well as low Q filters.

Discrete inductors can have higher Q than possible with an on-die integrated inductor. The use of SIP technology allow inductors of higher Q to be used than are available on low-cost IC substrates, but still keep the critical interconnects of the tuner within the SIP. This allows the tuner design to be optimized for cost and/or performance without requiring the customer to provide a PCB design that has critical RF layout requirements to support the tuner. This improves the ease-of-use of the tuner and improves repeatability, quality, and reliability. Also the tuner can be tested at the SIP level thus providing a higher level of confidence in the RF performance within the customer's product.

Due to the high Q of the tracking filter, the pass band is not wide and flat as in prior art complex tuner filters. To avoid attenuating the desired channel being tuned, the filter must be tuned accurately to the channel frequency. The tracking filters are calibrated for initial component errors by injecting a test tone signal into the filters and tuning the variable capacitors to the correct filter response. The filter Q can also be varied. A switch configuration on the front end enables calibrating the filters without leaking the test tone out the tuner input. A second calibration of the filters can be performed by comparing a fixed stable reference capacitor to a separate varactor with properties similar to the filter varactors and then correcting the voltage on the filter varactors according to the error measured in the separate varactor. In one embodiment, the reference capacitor and the separate varactor are put into an oscillator and the oscillator frequency is measured to detect changes in the capacitor values.

A front end switch configures the tuner front end for low noise, high linearity, good input return loss (S11) across the entire RF band, or applying the test tone in the calibration mode. The switchable mode enables the tuner to be effective during weak terrestrial reception, strong terrestrial reception, and connection to a cable plant. In an alternative to a switch, the amplifier parameters can be adjusted to achieve the desired trade off between noise figure and linearity.

With this single package implementation, a single low voltage supply compatible with normal integrated chip processes such as CMOS can be used (for example, 3 Volts). The high voltage needed for the varactors can be created through charge pumping, voltage stacking, diode/capacitor ladders or other known techniques. This high-voltage generator can be included on the IC die, included within a SIP, included on the PCB used to mount the tuner, or any combination of the aforementioned locations.

DETAILED DESCRIPTION OF THE INVENTION

Figure 1:
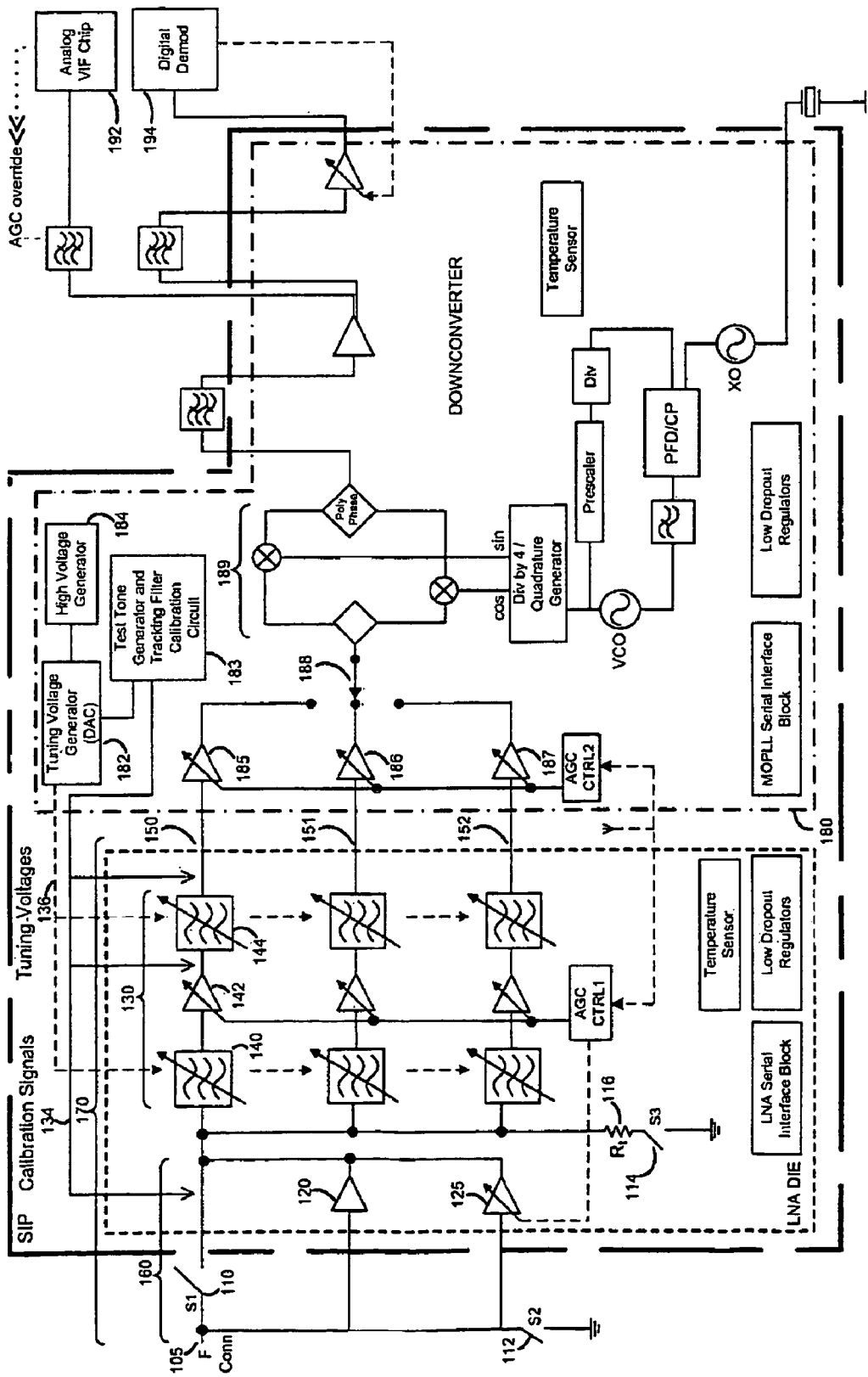
FIG. 1 shows the block diagram of an example tuner system of the present invention.

FIG. 1 shows an example of an implementation of a tuner front-end 170. The tuner front-end 170 includes multi-mode low noise amplifier 160 and tracking filter 130. Tracking filter 130 includes a first stage tracking filter 140, a Low Noise Amplifier (LNA) 142, followed by a second stage tracking filter 144 for desired selectivity. Although other filter line-up architectures known in the art are applicable, this example topology results in a lower noise figure (NF) by reducing the pass band losses with the first stage tracking filter 140 before the signal is amplified by the LNA 142. A single LC (inductor-capacitor) tank can be used in the first stage tracking filter 140 (i.e. one inductor and one or several capacitors). Because the LNA 142 receives a signal that has been band limited by the first stage tracking filter 140, the power handling requirement is reduced relative to a broader band LNA and therefore, the linearity is improved, resulting in less distortion. To further improve the receiver linearity, a variable gain function can be implemented in the LNA 142. The tuner front-end can comprise a single tracking filter.

The filtering/LNA function (140, 142) significantly band-limits the incoming signals and significantly reduces linearity requirement, noise figure and consequently power consumption requirements for the rest of the receive chain. In addition, the filtering reduces spurious conversion requirements for the rest of the receive chain. The most important spurious conversion mechanisms are conversion of jammers present at the image frequency as well as conversion of jammers from harmonics of the LO frequency. The filtering attenuates signal power at these frequencies, thereby reducing the image and harmonic rejection requirements for the rest of the receive chain.

The loaded Q of an LC tank of a filter design can be changed to trade off noise figure, distortion and/or flatness. The Q can be changed adaptively on a channel change or in real-time while the active signal is being processed. The necessary change in Q can be determined by power level detection with one or more power (broadband and/or in-channel) detectors or from a received-signal quality metric measured after the demodulator, for example, BER (bit error rate), SNR, or other metrics. The Q can be calibrated on a channel change to optimize gain and/or bandwidth and/or flatness. Q enhancement techniques can be employed. In communication systems, Q enhancement circuits typically use negative resistance circuits to cancel out parasitic loss in the passive inductor-capacitor (LC) resonators.

The example filter designs of the invention (FIG. 2, FIG. 3 and FIG. 4) encompass various techniques and combinations of techniques to optimize its performance. To avoid coupling between the capacitors (varactors) of the filters a further improvement that can be incorporated is the use of grounding techniques such as the star or bus grounding schemes. This reduces shared current between the stages and reduces stray inductance to ground, which would reduce the rejection capability.

The tuner design can utilize an image rejection mixer (IRM) with the tracking filter to provide image rejection. This image rejection method reduces the complexity and cost of the front end filtering, and can eliminate the need for a notch filter.

A technique to extend the tuning range of the varactors is to switch in multiple fixed value capacitors in parallel with the varactors in a filter. Since a larger proportion of the total capacitance now consists of linear capacitance, the linearity improves and the varactor may no longer need to be of a high-voltage type. Furthermore, with this approach it is even possible to eliminate the varactors altogether. In this case the variable capacitance is solely obtained by switching in or out fixed capacitors. Indeed, this type of switched capacitor array may interchangeably be used instead of or in combination with varactors for all the circuit techniques and architectures discussed in this document.

FIG. 1 shows the block diagram of an example of a TV tuner. The RF input signal 105 first reaches multi-mode low noise amplifier 160 with an optional set of switches 110, 112, 114 and amplifiers 120 and 125, which enable a choice of reception modes, each optimized for different reception conditions. The tracking filter 130 that follows is split between a first stage tracking filter 140, followed by an LNA 142 with optional VGA function and finally a second stage tracking filter 144. The active components of the tuner front end 170 can be integrated into a single die to achieve high performance, low component count, and low cost. The desired frequency responses of the tracking filters 140, 144 are adjustable by applying tuning voltages 136 to the variable capacitance (for example, varactors) used in the filters. The tuning voltages are created by circuit 183, the high voltage generator 184 and the tuning voltage generator (also known as the voltage driver circuit) 182. Due to the multi-octave requirements of the front-end, several tracking filters 130 may be required. In this example three tracking filters 130 are used. The first stage tracking filters 140 for all bands is a first order band pass filter (BPF) (i.e. single tank). The order of the second stage tracking filter 144 may depend on the band. In this example the following choice has been made: first order—Low VHF 150, first order—Mid VHF 151, second order—UHF 152. The three first stage tracking filters 140 have their inputs coupled together (all filters driven in parallel) and while the three second stage tracking filters 144 can have their outputs 150, 151, and 152 connected together in parallel; sometimes it is advantageous to connect them to separate active circuit inputs in order to lower the risk of spurious resonances. However, parallel connection can be a viable option, especially if de-Qing of unused tanks is employed as described below.

In this example, the tuner front end 170 with tracking filters 130 are followed by a downconverter block 180. There are many ways of connecting the tuner front end outputs 150, 151, 152 to this block and selecting the band of interest. In this example each of the second stage tracking filter outputs 150, 151 and 152 are connected to their own VGAs 185, 186, and 187, followed by a selector switch 188. Downconverter 189, which can be an image rejection mixer, frequency translates the filtered RF signal to another frequency, typically a lower intermediate frequency. The downconverter output signals are input signals to an analog video intermediate frequency (VIF) chip 192 or to a digital demodulation chip 194. The VIF chip 192 may accommodate an analog system using standards such as the National Television Standards Committee (NTSC), Phase Alternating Line (PAL), and Sequential Color with Memory (SECAM). The digital demodulation chip 194 may accommodate digital systems using standards such as Advanced Television Systems Committee (ATSC), Digital Video Broadcasting and Integrated Services Digital Broadcasting for terrestrial television (DVB-T or ISDB-T respectively), and Quadrature Amplitude Modulation (QAM).

While this example illustrates a number of advantageous combinations, there are many other line-up combinations with different performance and cost optimizations. Each signal path can be constructed with any number of LNAs (fixed or variable gain) and any number of filter section combinations. The order in which they are connected and the complexity of each filter section (filter order and type) can provide various performance and cost trade-offs. The filter sections can be low-pass, peaked-low-pass, high-pass, peaked-high-pass, band-pass and filter functions of even greater complexity. The filter sections can include one or more transmission zeros. The filter sections can include two or more tightly-coupled stages, or two or more lightly-coupled sections, or various combinations of both lightly-coupled and tightly-coupled stages. The filter sections can be first order, second order, third order or higher. To cover frequency ranges that are too large for one signal path to handle the signal path can be split into 2, 3, 4, 5, 6 or more parallel paths.

As shown in FIG. 1, the tuner multi-mode low noise amplifier 160 may employ a front-end switch 110, LNA 120, QAM AMP 125, switch S2 112, and switch S3 114 to offer one or more reception modes and one or more calibration modes, all with different characteristics. In this example we illustrate three reception modes and one calibration mode:

1. Low noise figure (NF) mode: This mode can advantageously be used during weak terrestrial reception conditions when the desired signal is very weak and the jammer level is low to moderate. Here switch S1 110 is off and the input signal is routed through the low noise figure (low NF) amplifier (LNA) 120 and into first stage tracking filter 140 of tracking filter 130. The "QAM AMP" LNA 125 is off or disconnected. Thus a very low noise figure can be obtained and since the jammers are low to moderate power the associated lower linearity is acceptable.
2. High linearity mode: This mode can advantageously be used during terrestrial reception conditions when the desired signal is not very weak. Here switch S1 110 is on and the "Low NF" LNA 120 and "QAM AMP" LNA 125 are off and/or disconnected. Thus the input signal is routed straight to the first stage tracking filter 140 and all the linearity advantages outlined previously are obtained. However, both the switch 110 and the first stage tracking filter 140 contribute noise before reaching the LNA/VGA 142 and therefore the noise figure will be higher than in the low-noise figure mode.
3. Cable mode: This mode can advantageously be used when the receiver is connected to a cable plant. Here it is usually required to have good linearity and good input return loss (S11) across the entire band but noise figure is not usually as important as with terrestrial reception. The high linearity mode of case 2 above offers good linearity but it is difficult to ensure good input return loss (S11) for frequencies far from the desired channel frequency. To solve this, an amplifier 125 with good linearity and broadband input match is used Switch S1 110 is turned off and the input signal is passed through the "QAM AMP" LNA 125 and into tracking filter 130. The "Low NF" LNA 120 is off or disconnected. The "QAM AMP" LNA 125 can incorporate variable gain in order to optimize the tradeoff between noise and linearity in response to varying receive power levels from the cable plant. QAM AMP derives its name from quadrature amplitude modulation commonly used for digital television in a cable plant.
4. Calibration mode: During the calibration sequence of the tracking filters, calibration signals 134 from test tone generator and tracking filter calibration circuit 183 will be applied to the tracking filter 130. It is important to ensure that these signals do not cause unacceptable RF emissions. This is especially a concern for the first stage tracking filter 140, which are the closest to the RF input. Thus, in the calibration mode, the first stage tracking filter 140 is isolated from the input by disabling the "Low NF" LNA 120 and "QAM AMP" LNA 125 as well as turning OFF switch S1 110 and turning ON optional switch S2 112 (in the case when the change of the input return loss caused by closing the switch S2 112 is acceptable). Optional switch S3 114 is turned on such that the filter is connected to the correct termination impedance 116 (Rt) during calibration. Alternatively the impedance can be provided by the output of the "Low NF" LNA 120 or "QAM AMP" LNA 125 blocks.

Switch S1 110 is preferably a low series-resistance switch such as a PIN diode but it can also for example, be implemented using MOS devices. Switches S2 112 and S3 114 can cost-effectively be implemented as MOS switches. Also, FIG. 1 shows the "Low NF" LNA 120 and "QAM AMP" LNA 125 as two distinct blocks for clarity but due to their very similar functionality, using techniques well known in the art, the blocks can be merged into a single block. If necessary, the different performance trade-offs for Low NF mode and high linearity mode can be implemented with several known techniques, for example, by using a switch to switch-in or short a degeneration resistance in series with the emitter or source of the gain device. When the degeneration resistor is shorted, the noise figure will improve at the expense of linearity; this is suitable for low NF mode (case 1) operation. When the shorting switch is off, the gain device will be degenerated and the linearity improves at the expense of noise figure; this can be suitable for high linearity mode (case 2) operation.

The capacitance at the input to the first stage tracking filter 140 will vary depending on whether amplifiers 120 and/or 125 are active. A capacitor in series with a switch can be added to the input of the first stage tracking filter 140 to compensate for the changing capacitance of the amplifiers 120, 125. This maintains at the input of the first stage tracking filter 140 a constant total input capacitance that contributes to the filter frequency response.

The determination of whether to use high linearity or low noise figure mode can be made each time a new channel is selected. The decision can be made based on locking and AGC information from the demodulator. For example, if the demodulator AGC register indicates high gain and the demodulator fails to lock then it is likely that the desired signal strength is very weak and the tuner can be put in low noise figure mode after which the demodulator can attempt to lock again.

Figure 2:
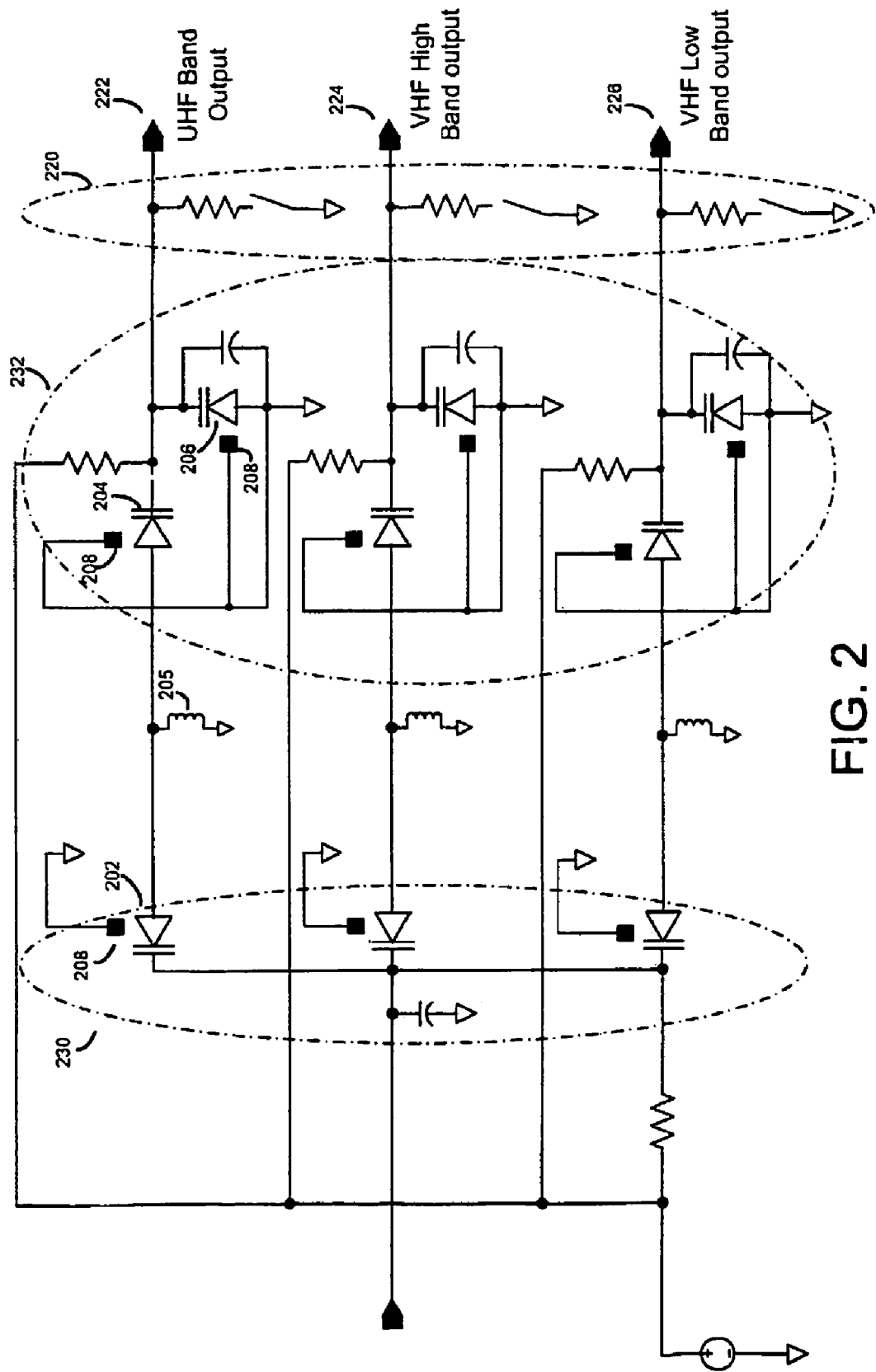
FIG. 2 shows an example of a first stage tracking filter with parallel paths.

FIG. 2 shows details of an example of the first stage filter circuits of FIG. 1 using on-die high voltage varactors 202, 204, and 206 to tune the filter frequency. In addition to the desired resonance frequency the parallel coupling of the tanks can cause unwanted resonances that can cause reduced attenuation at certain frequencies. If desired, these resonances can be dampened by switching in resistors to de-Q the unused sub-tanks. De-Qing circuit 220 is shown in FIG. 2. Thus, if the VHF low band path 226 is used then the resistor of that band would be switched out whereas the resistors of the VHF high band 224 and the UHF band 222 would be switched in. The inclusion of these extra resistors only entail a very small degradation of performance at the desired frequency. Input coupling 230 determines noise figure. Output coupling 232 provides gain compensation. Substrate connections 208 are shown for an integrated varactor; these substrate connections 208 would not be present for on off-die varactor.

Figure 3:
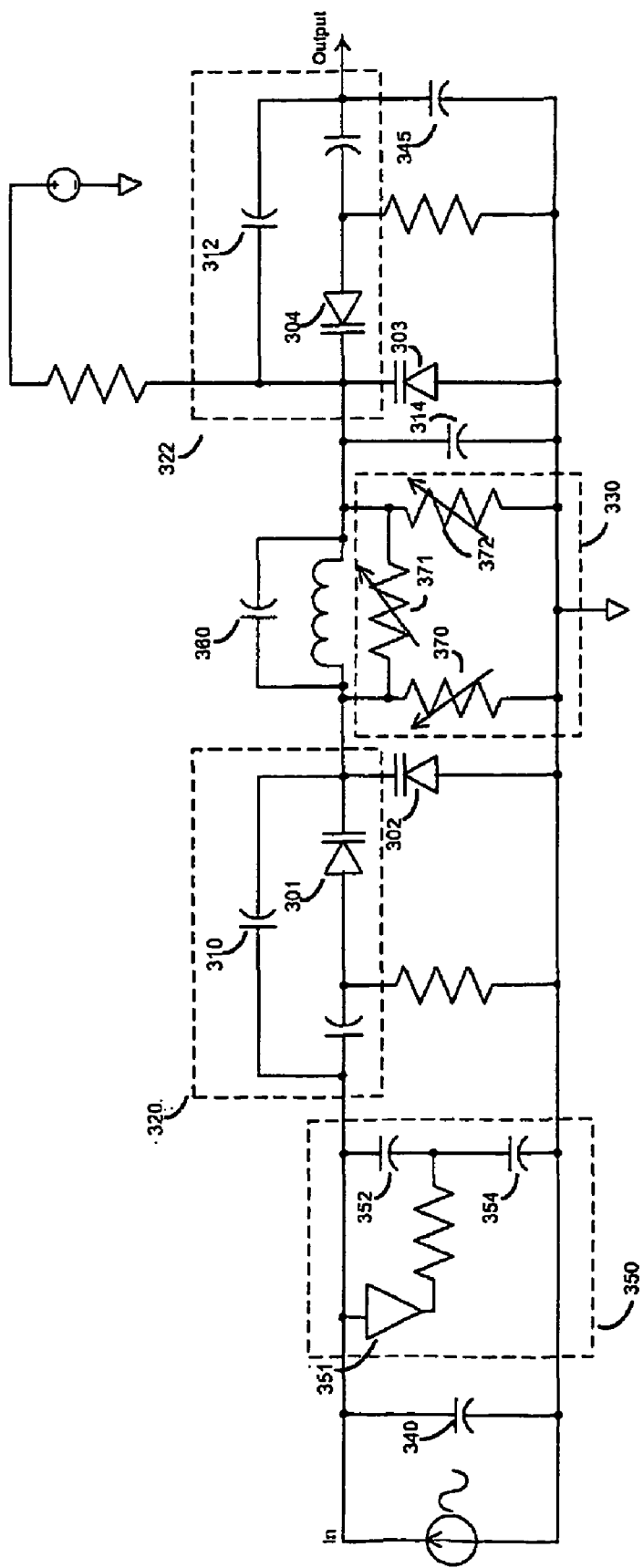
FIG. 3 shows an example of filter circuitry for a second stage filter using high voltage varactors and also illustrates the use of a buffer to create negative conductance and some examples of programmable loss elements.

FIG. 3 shows an example second stage filter circuit, which can be used for VHF band, (for example, second stage tracking filter 144 of FIG. 1) using on-die high voltage varactors 301, 302, 303 and 304 to tune the filter frequency. The transfer characteristic is asymmetrical, favoring attenuation at high frequencies, thereby improving image and harmonic rejections. Both the input and output nodes are completely isolated by linear capacitors. Therefore, the preceding and following stages can have any DC bias voltage without disturbing the tuning. Additional high value (and therefore large silicon area) AC coupling capacitors are avoided because the capacitors are an integral part of the tracking filter design. Also, with the exception of capacitors 310, 312, and 314, all linear capacitors have low or zero DC voltages across them. This enables silicon area savings by allowing the use of denser low-voltage capacitors. Optional capacitors 310, 312, and 314 can have high DC voltages across them but they are relatively small value and do therefore not consume excessive silicon area.

An input shunt capacitance 340 is an integral part of the tracking filter and its value can be made relatively large, which makes the tracking filter very tolerant towards parasitic capacitance from the preceding stage; it can simply be absorbed into the tracking filter. Likewise the filter incorporates an output shunt capacitance 345, which improves its tolerance towards parasitic capacitance from the following stage.

Desired capacitance versus tuning voltage relationship can be approximated by combination of varactor and fixed capacitors as shown in blocks 320 and 322. This avoids multiple different tuning voltages.

The circuit shows an optional negative conductance cell 350 for Q enhancement. It is highly linear because it only uses a voltage follower buffer 351. Compared with other known approaches, noise is low because noisy current sources are avoided. In addition, by choosing capacitor 354 greater than capacitor 352, it can be shown that the noise is less than 4 kT|G| where G is the desired negative conductance.

Capacitor 360 is an optional capacitor for implementing a transmission zero.

Three programmable loss elements 370, 371, and 372 are shown in de-Qing circuit 330 which can be used to de-Q the resonators. These loss-elements can be continuously adjustable, switchable or a combination of both. Also these loss elements can be switched out of circuit if necessary. The loss elements are only shown at example locations in the filter. Indeed, the de-Qing effect can be obtained by placing these elements across any nodes in the filter.

FIG. 3 also shows a schematic example of where a Q enhancement circuit 350 can be placed and also shows examples of an additional feature where the inclusion of adjustable loss elements 370, 371, and 372 allow flatness, gain, noise figure and/or distortion to be traded off for various optimizations to be provided for various signal types. An example optimization could be the inclusion of loss to provide improved flatness for cable TV signal reception.

Figure 4:
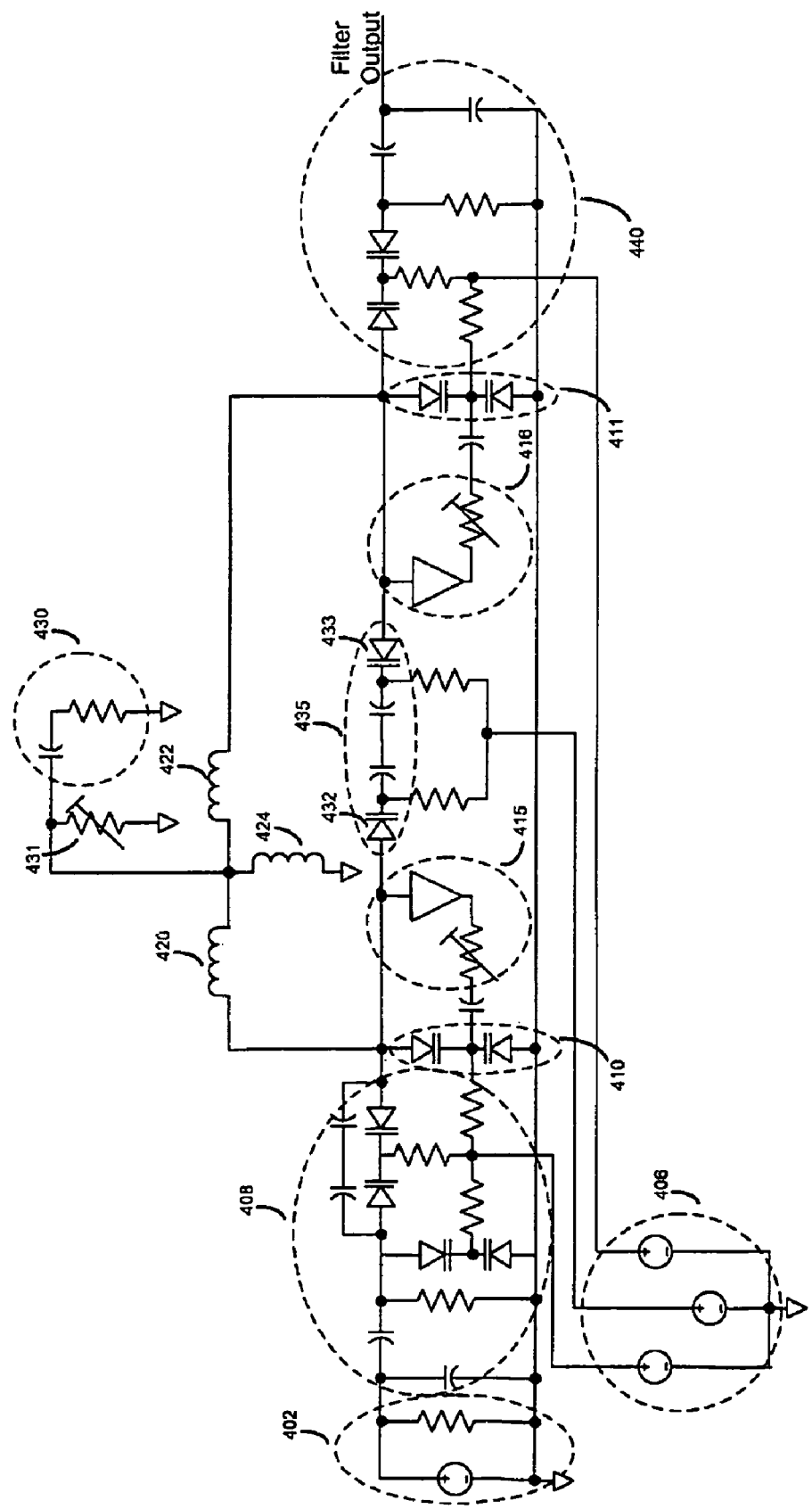
FIG. 4 shows an example of second stage filter circuitry using high voltage varactors and coupled tanks for improved selectivity.

FIG. 4 shows an example of a second stage filter, which can be used for UHF band. This filter uses two inductors 420 and 422 and a smaller coupling inductor 424. The main tank capacitance is illustrated at 410 and 411. The input coupling network 408 determines the noise of the filter. Circuit 402 is the source model. Circuit 406 provides the tuning voltages. Optional circuits 415 and 416, each containing a variable resistance and buffer, provide negative conductance which has good linearity and noise performance. Optional resistor 431 together with the single-end negative conductance approximate a floating negative conductance across the off-chip inductor. This provides Q enhancement to the passband as well as the transmission zero. Small varactors 432 and 433 are used to cancel part of the bottom inductor coupling to provide the desired coupling at a particular frequency. These varactors, forming equivalent capacitance 435 connected effectively in parallel with the series combination of inductors 420, 422 also provide a transmission zero at higher frequency that helps image rejection. In addition, the capacitive coupling 435 effectively decreases the amount of inductive coupling by bypassing the inductors at higher frequencies, thereby narrowing the passband. In addition, together with the coupling inductor 424, it introduces a transmission zero, which improves high frequency attenuation. This can be used to improve the image rejection. Output coupling network 440 helps maintain a fairly constant gain over frequencies.

The filter utilizes parallel tank resonance and therefore has a more symmetrical transfer characteristic than the second stage filter of FIG. 3. This results in improved low-frequency attenuation. The high-frequency attenuation is still sufficient due to the higher filter order as well as the transmission zero. If additional selectivity is required an optional Q-enhancement scheme (415, 416 and 431) can be used as well as an optional RC network 430, which can aid in suppression of parasitic oscillations.

The coupled-tank filter of FIG. 4 retains many of the advantages of the filter shown in FIG. 3. For example, the input and output are completely isolated by linear capacitors, preventing DC bias voltages from both the preceding and subsequent circuitry to disturb the tuning. Also, input and output shunt capacitors are employed and, with the exception of a few low-value capacitance, all linear capacitances can be of the low-voltage type.

The large tuning range of high voltage varactors allows for fewer filtering bands to cover the broad input range; this results in fewer inductors needed. The high voltage (HV) varactors can be well-to-substrate junctions or can be fabricated with either existing process steps present on a standard low-cost IC process or with the addition of one or more process steps. An example is the collector-base junction of a bipolar transistor by appropriately adjusting the implant doses to create a large capacitance tuning range across high voltage. A further option that can be used to reduce the tuner cost is to split the monolithic IC die into two or more die in a SIP. This helps to reduce cost if the addition of the high voltage varactors increases the cost of the process. If this is the case then one or more of the two or more IC die can then use standard low cost IC processes. Similarly multiple dissimilar IC die can be incorporated into a SIP to enable optimization of cost and/or performance. A further benefit that can be obtained by splitting the IC die into two or more die is an increase in isolation between signal paths within the tuner.

One example of an improvement between this invention and prior art found in traditional can-tuners is that can-tuner filtering uses more inductive elements to achieve wider and flatter passband filter response to compensate for tuning inaccuracies (initial adjustment error, tracking errors over each band, etc.), power supply variation and drift due to temperature and aging. The present invention uses fewer inductors, can produce a narrower response, and calibrates the variable capacitors and filter response to compensate for tuning inaccuracies.

Figure 5:
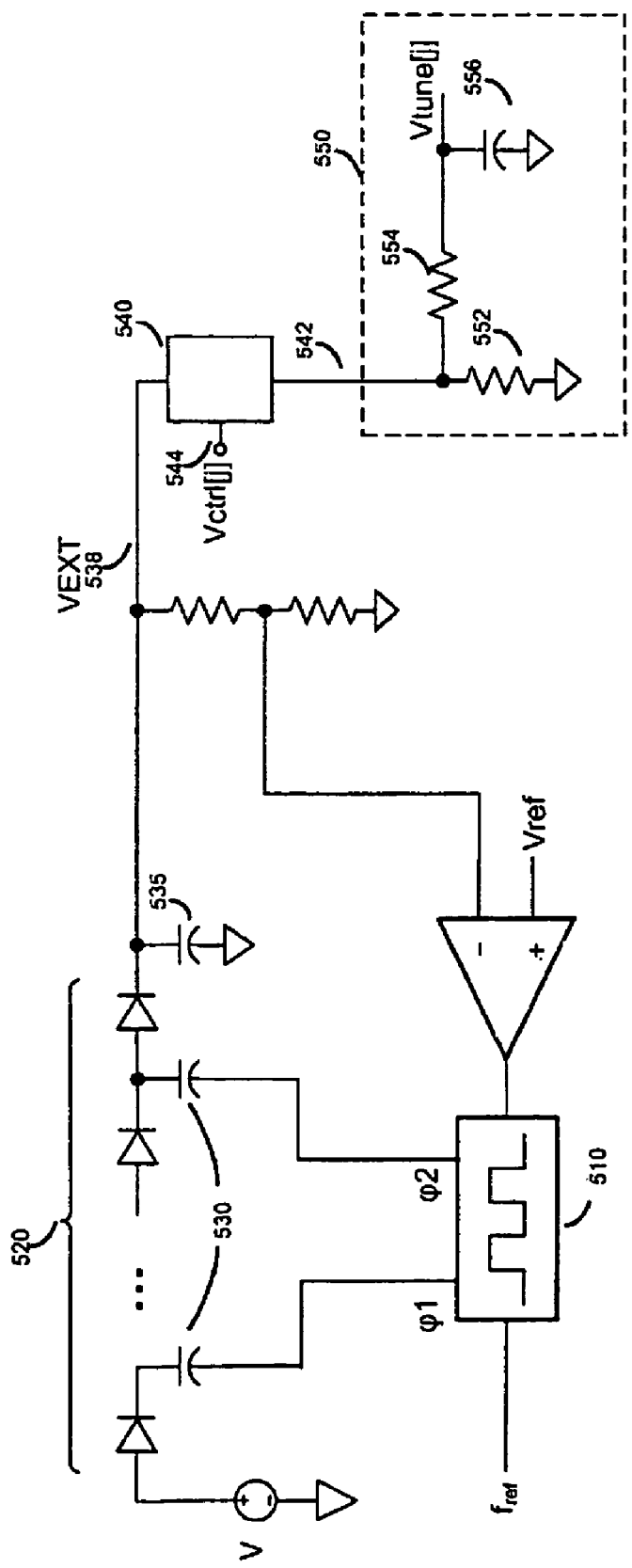
FIG. 5 shows an example of a high-voltage supply generator used to supply the high-voltage integrated varactor driver circuit.
Figure 6:
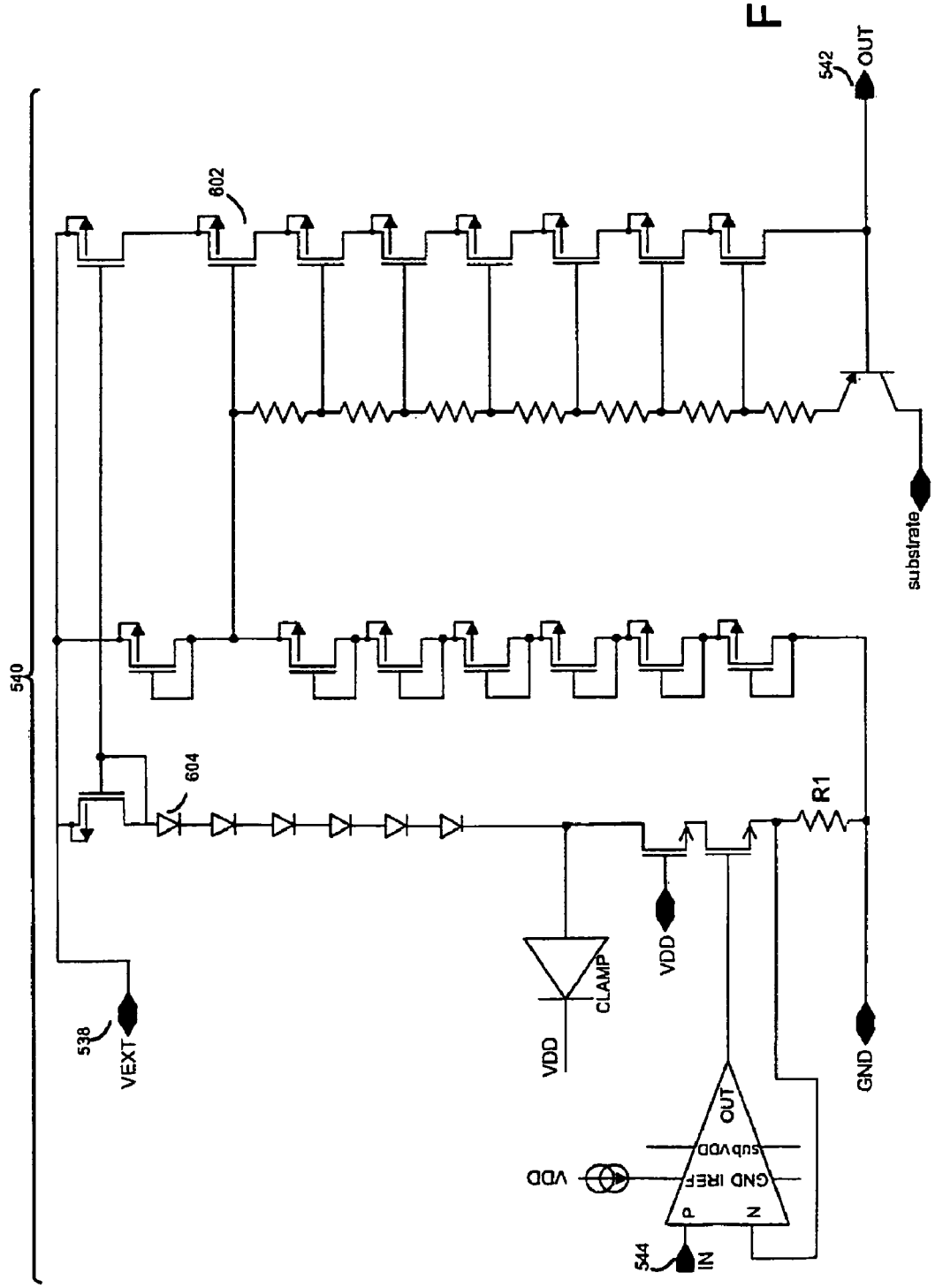
FIG. 6 shows an example of a high-voltage integrated varactor driver circuit.

FIGS. 5 and 6 show an example of a voltage generation system (FIG. 1 Tuning Voltage Generator 182 and High Voltage Generator 184) for use with high voltage varactors with example schematics of the voltage multiplier and varactor driver circuit respectively. This example system resides primarily on an IC die with some discrete components residing within a SIP and on the external PCB.

FIG. 5, the voltage multiplier, uses multiple diode/capacitor stages 520 (for example, 16 diodes with 16 capacitors 530), an amplitude-controlled 2-phase clock generator 510, and voltage driver 540. The voltage driver 540 and output stage 550 circuitry will be repeated for as many independent Vtune voltages needed. Resistor 554 and capacitor 556 filter out noise and ripple. Example values for capacitors 530 are 3.3 pF, resistor 552 is 4 Mohms, resistor 554 is 1 Mohms, capacitor 556 is 10 pF, and capacitor 535 is 1 nF. Each voltage driver 540 has input signal VEXT 538, control signal Vctrl[j] 544, and output signals 542.

FIG. 6 shows an example of the voltage driver 540. The high voltage varactor driver uses PMOS transistors 602 and diodes 604 in a configuration such that they avoid breakdown issues across their terminals due to the 3V process. The circuit topologies take advantage of the fact that certain junctions of a low voltage process can withstand much higher voltages than the supply voltage rating for that process. For example, the well-to-substrate diode found in the PMOS transistor, the P-N diode and the vertical PNP transistor have junctions that can withstand higher voltages in a N-well process. Similarly, other processes typically have some diode junctions and/or isolation barriers that can withstand much higher voltages than the rated supply. Another example is the use of routing metal structures that can withstand voltages much higher than the supply rating. These routing metal structures can be used to create capacitors.

Figure 7:
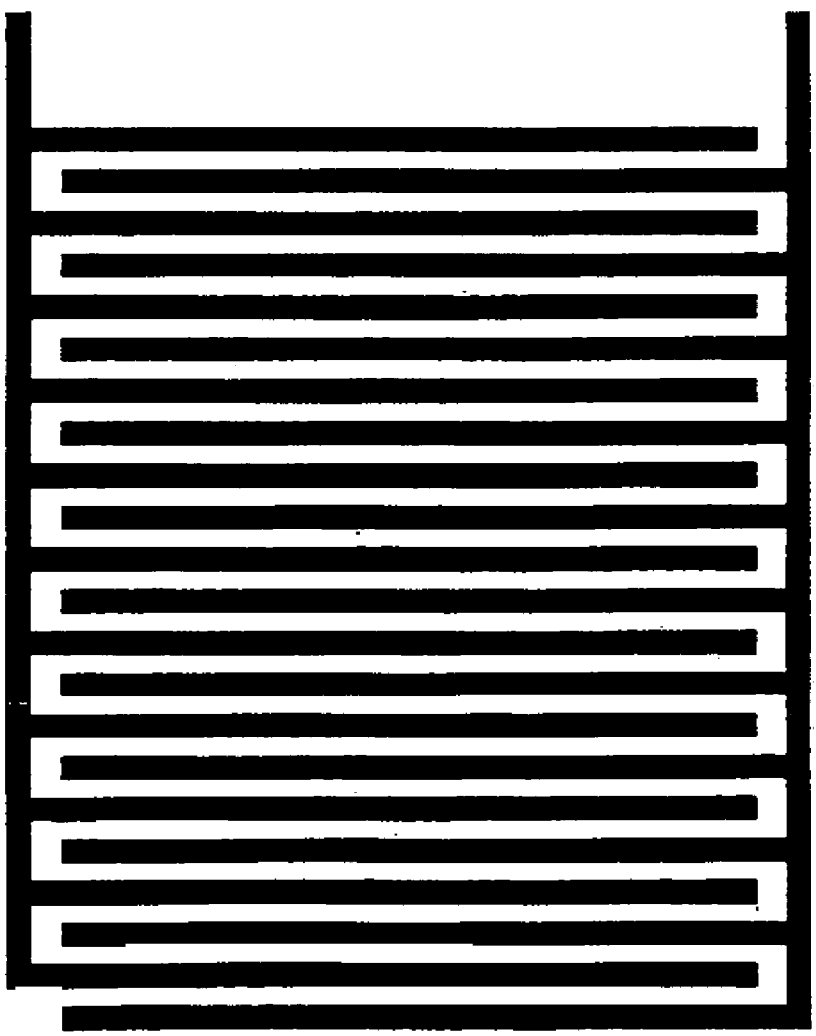
FIG. 7 shows an example of a high-voltage linear capacitor structure using routing metal and fringing capacitance.

FIG. 7 shows an example metal routing structure used to create high voltage capacitors.

Figure 8:
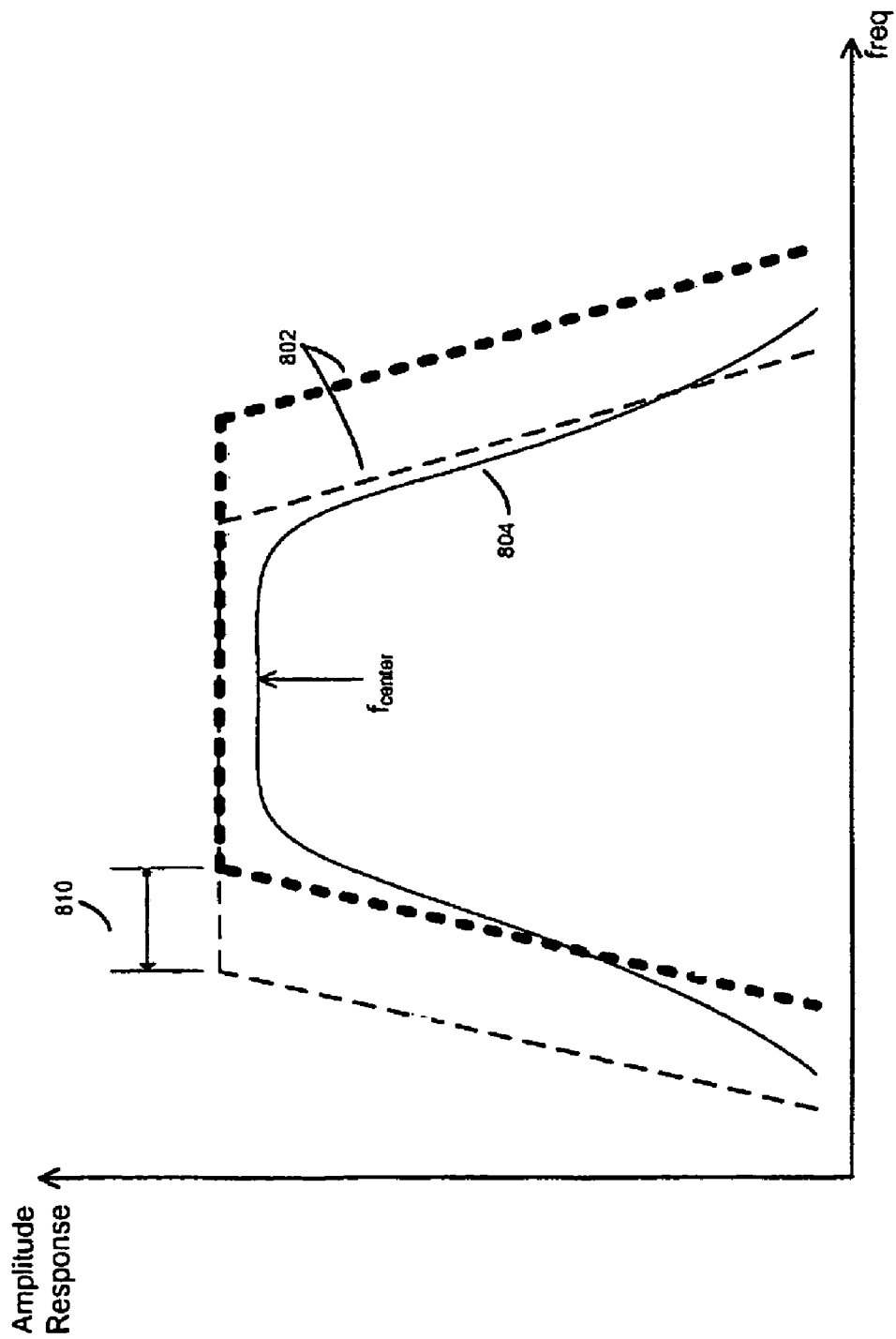
FIG. 8 shows an example of filter amplitude responses for both prior-art filters and for filters using techniques according to the present invention.

FIG. 8 shows the relationship of prior art filter response 802, shown in two positions due to frequency drift 810, and the filter response 804 using the present invention. Frequency drift 810 in prior art tracking filter response is due to parameters such as temperature changes and mismatch in varactors. The present approach uses reduced complexity filters that have fewer inductive elements and therefore reduced cost. This results in a less flat passband which requires far greater tuning accuracy; this is accomplished with calibration. For an example of a calibration method see "System for Calibration of integrated circuit Filters" Ser. No. 11/300,047 filed Dec. 14, 2005, assigned to a same assignee as the present application and incorporated herein by reference, which claims priority to Ser. No. 60/636,375, filed Dec. 15, 2004.

Another disadvantage of the prior art approach is the use of discrete varactors which results in worse matching than can be achieved by integrating the varactors on a single die. This reduced matching in the prior art approach also contributes to the tuning inaccuracy and drift previously described. A further advantage of the present approach is improved filter accuracy over temperature. Specifically, the temperature coefficients of the varactors will match very well and this allows the use of a reference varactor whose temperature and temperature coefficient will match very closely with the varactors used in the filters. The capacitance of the reference varactor can be monitored and its tuning voltage can be automatically adjusted to ensure constant capacitance. This information can be used to update the tuning voltage of the filter varactors, thereby ensuring very accurate compensation of capacitance drift due to temperature changes, power supply voltage changes, ageing, etc. A method for accomplishing this is disclosed later in this document.

The use of filter calibration eliminates the need for manual or automated external adjust of the tracking filters. This reduces cost, improves the quality and improves the reliability of the device. Also, unlike can-tuners, the filter can easily be re-calibrated when desired, thus further improving accuracy.

The Variable-Capacitance-Calibration-System discussed in the next section is an example of one possible implementation applied to a system using varactors. The calibration system proposed makes use of one or more matched variable-reference-capacitors so that the capacitance of one or more signal-path-variable-capacitors can be indirectly measured without any connection between the measurement circuit and the signal path. This can be achieved by measuring the capacitance of one or more matched reference-variable-capacitors residing within the calibration circuit that may also be configured with substantially the same conditions as the signal-path-variable-capacitors. Also the reference-variable-capacitors can reside on the same substrate as the signal-path-variable-capacitors and can be configured with their geometry and placement such that they substantially match each other. The result from the one or more measurements can then be used to correct the one or more signal-path-variable-capacitors and provide signal-path-variable-capacitors that can be substantially stable and independent of temperature, time, power supply variation and other mechanisms that induce unwanted capacitance change. If the initial errors between the reference capacitor and the signal-path capacitors are calibrated out then only capacitance-change-mechanisms require matching, for example, temperature drift, aging, supply dependency and any other unwanted change-mechanism.

Figure 9:
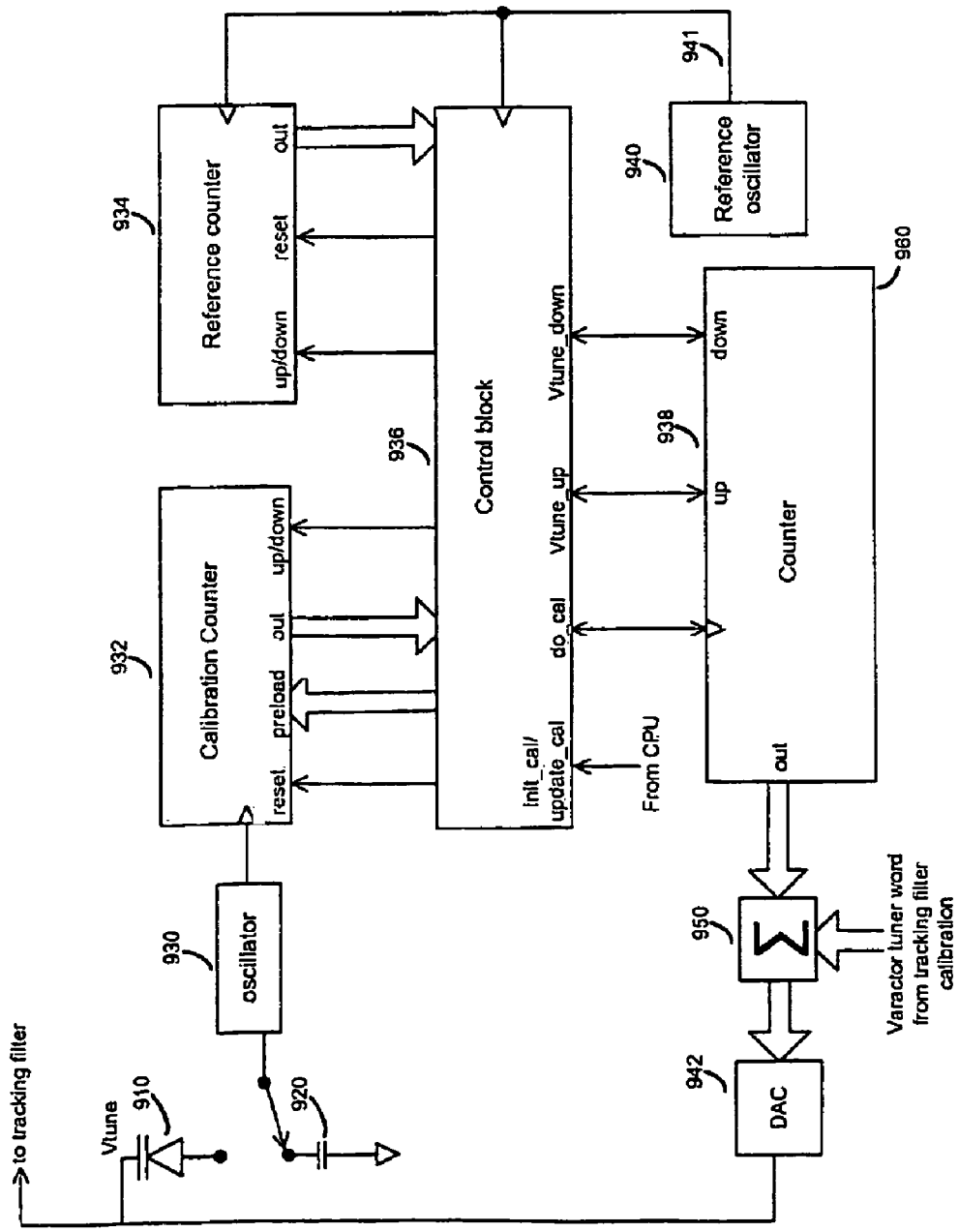
FIG. 9 shows a block diagram of a varactor calibration circuit.
Figure 10:
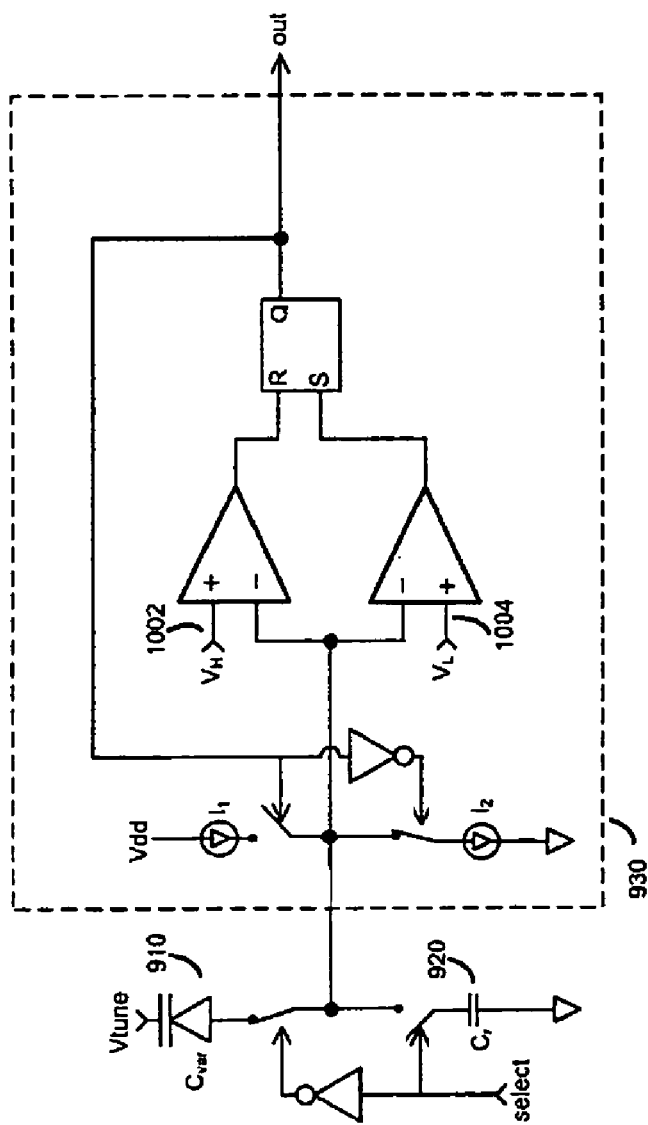
FIG. 10 shows an example of a relaxation oscillator topology.

FIGS. 9 and 10 illustrate an example of the calibration that uses varactors but any type of variable capacitor can benefit from this method. Variable capacitors can be constructed with continuously variable capacitors (such as varactors, bipolar-junction-transistor junctions, MOSFETs, MEM capacitors, etc.) and/or with discrete switched capacitor banks. The example of this method shows one capacitance-to-time measurement system which is used to extract the capacitance ratio between a reference-variable-capacitor 910 and a stable fixed-reference-capacitor 920, but there are many other capacitance-to-time systems that can be used. Additionally, other capacitance measuring techniques can be employed, for example, AC driven bridge methods, current and voltage measurement methods and any other methods that may be applicable.

FIG. 9 shows a block diagram of a varactor drift calibration circuit. The circuit has a stable reference capacitor 920, a reference varactor 910, an oscillator 930 to convert capacitance to frequency, a calibration counter 932, and reference counter 934, and control block 936, a counter 938, a reference oscillator 940 to drive the reference counter and control block, error counter 960 to accumulate the drift error and produce a drift calibration value, summer 950 to sum the drift calibration value with the varactor tuner word; and a digital-to-analog converter 942 to drive the reference varactor 910 and the tracking filter varactors.

The varactor calibration circuit measures capacitance of varactor 910 and compares it to a fixed and stable reference capacitance 920. Thus, if the varactor 910 capacitance has changed due to temperature drift, aging, power supply, or any other reason, then the calibration circuit will detect it and correct.

More specifically, the calibration circuit measures the ratio of varactor capacitance to reference capacitance and the calibration method uses two distinct sequences:

1) Initial calibration sequence: As soon as possible after a tracking filter calibration, the ratio between varactor and reference capacitance is measured. The ratio is stored.

2) Update calibration sequence: Whenever a re-calibration is desired (for example, a re-calibration can be performed when an environmental parameter such as temperature or power supply voltage changes more than a prescribed amount or the re-calibration can be performed at regular time-intervals) then the circuit wakes up and re-measures the ratio between varactor 910 and reference capacitance 920. If this ratio is different than the previously stored value then the circuit directs the tuning voltage to change in a compensating direction.

Thus, the calibration is essentially a closed-loop system that keeps the varactor capacitance constant. It is also worthwhile noting that the circuit is insensitive to the value of the reference capacitance 920 as long as it is stable. Indeed, only the reference capacitor needs to be stable, none of the other analogue blocks need to be. Also, there is no requirement for absolute accuracy of any block or signal. Finally, the value of varactor 910 does not need to match with the varactors in the tracking filter, only its drift needs to match, i.e. it must have the same temperature, same aging characteristics, etc. This makes the circuit very accurate, robust, and easy to design.

The following subsections entitled Oscillator Considerations, Initial Calibration Sequence, and Update Calibration Sequence describe in detail an example implementation of the calibration system.

Oscillator Considerations

FIG. 10 shows an example of a relaxation oscillator topology. An oscillator 930 is used for converting capacitance into frequency. In addition to the oscillator topology circuit shown in FIG. 10, there are several known oscillator topologies that are suitable for the purpose of presented.

It is important to ensure that the average voltage $C_{var}$ across the varactor 910 is relatively close to the average voltage across the varactors in the filter under calibration. This ensures that the operating points of the varactors are similar and that subsequent temperature change, supply voltage change, etc. will have the same effect on all the varactors. It is therefore important that $\Delta V = V_H$ (1002)$-V_L$ (1004) is small and that $V_L$ is close to the average anode voltage of the varactors in the filters (which is usually ground).

Initial Calibration Sequence

This sequence is performed after a tracking filter calibration. It is crucial that the varactor capacitance does not change significantly between the tracking filter calibration completion and this initial calibration sequence. The temperature during this sequence is denoted $T_{init}$. First the relaxation oscillator 930 is configured to use the reference capacitor 920.

The oscillation period is:

$$t_1(T_{init}) = \frac{C_r(T_{init}) \cdot \Delta V(T_{init})}{I_1(T_{init})} + \frac{C_r(T_{init}) \cdot \Delta V(T_{init})}{I_2(T_{init})}$$

$$= C_r(T_{init}) \cdot \Delta V(T_{init}) \cdot \left(\frac{1}{I_1(T_{init})} + \frac{1}{I_2(T_{init})}\right)$$

A specific number of cycles, $N_{ref}$, is counted and during this time the reference counter 934 counts $R_{ref}$ cycles where:

$$R_{ref}(T_{init}) = N_{ref} \cdot t_1(T_{init}) \cdot f_x(T_{init})$$

This oscillator frequency, $f_x()$ 941, is relatively non-critical and does not need to be temperature-stable.

However, since a crystal oscillator is typically present in the system, it can usually conveniently be derived from this.

Then the relaxation oscillator 930 is switched to use the varactor 910 and now the oscillation period is:

$$t_2(T_{init}) = C_{var}(T_{init}) \cdot \Delta V(T_{init}) \cdot \left(\frac{1}{I_1(T_{init})} + \frac{1}{I_2(T_{init})}\right)$$

The reference counter 934 is counted down to 0 again and during that time the calibration counter 932 is counted down from $N_{ref}$. When the reference counter 934 reaches 0 then the calibration counter 932 will have the following value:

$$R_{cal} = N_{ref} - \frac{R_{ref}(T_{init})}{f_x(T_{init})} \cdot \frac{1}{t_2(T_{init})}$$

$$= N_{ref} \cdot \left(1 - \frac{t_1(T_{init})}{t_2(T_{init})}\right)$$

$$= N_{ref} \cdot \left(1 - \frac{C_r(T_{init})}{C_{var}(T_{init})}\right)$$

Thus $R_{cal}$ measures the ratio between the varactor 910 capacitance and the reference capacitance 920 and we can now redo the sequence at a different temperature and adjust the varactor voltage until the same ratio is reached. Since the reference capacitance 920 is temperature-stable then the varactor 910 capacitance also ends up being temperature-stable.

Update Calibration Sequence

Once the initial calibration sequence has been performed, we can use the resulting $R_{cal}$ value to perform the actual corrective calibration sequence. This sequence should be run every time an accuracy adjustment of the varactor capacitance is required, for example, when the temperature $T_{cal}$ changes more than a prescribed amount or at a regular time-intervals. The first step of the sequence is identical to the initial calibration, namely configuring the relaxation oscillator 930 to use the reference capacitor 920 and counting $N_{ref}$ cycles in the calibration counter. During this time the reference counter 934 counts $R_{ref}$ cycles where:

$$R_{ref}(T_{cal}) = N_{ref} \cdot t_1(T_{cal}) \cdot f_x(T_{cal})$$

and where:

$$t_1(T_{cal}) = C_r(T_{cal}) \cdot \Delta V(T_{cal}) \cdot \left(\frac{1}{I_1(T_{cal})} + \frac{1}{I_2(T_{cal})}\right)$$

In the second step of the sequence, the calibration counter 932 is preloaded with the previously determined value of $R_{cal}$, the relaxation oscillator 930 is switched over to use the varactor 910 and is allowed to oscillate until the calibration counter 932 reaches $N_{ref}$. During this time the reference counter 934 is counted down and at the end of the period it will have reached a value of:

$$R_{final}(T_{cal}) = R_{ref}(T_{cal}) - (N_{ref} - R_{cal}) - t_2(T_{cal}) \cdot f_x(T_{cal})$$

where $$t_2(T_{cal}) = C_{var}(T_{cal}) \cdot \Delta V(T_{cal}) \cdot \left( \frac{1}{I_1(T_{cal})} + \frac{1}{I_2(T_{cal})} \right)$$

Inserting the previously derived expressions yields $$R_{final}(T_{cal}) =$$

$$\frac{C_r(T_{init})}{C_{var}(T_{init})} \cdot C_{var}(T_{init}) \cdot \Delta V(T_{init}) \cdot \left( \frac{1}{I_1(T_{init})} + \frac{1}{I_2(T_{init})} \right) \cdot f_x(T_{cal})$$

$$R_{final}(T_{cal}) = N_{ref} \cdot t_1(T_{cal}) \cdot f_x(T_{cal}) - \frac{C_1(T_{init})}{C_{var}(T_{init})} \cdot (t_2(T_{cal}) \cdot f_x(T_{cal}))$$

$$R_{final}(T_{cal}) = f_x(T_{cal}) \cdot \Delta V(T_{cal}) \cdot$$

$$\left( \frac{1}{I_1(T_{cal})} + \frac{1}{I_2(T_{cal})} \right) \cdot N_{ref} \cdot \left( C_r(T_{cal}) - \frac{C_r(T_{init})}{C_{var}(T_{init})} \cdot C_{var}(T_{cal}) \right)$$

We see that $R_{final}(T_{cal})$ is 0 when:

$$C_r(T_{cal}) - \frac{C_r(T_{init})}{C_{var}(T_{init})} \cdot C_{var}(T_{cal}) = 0$$

or:

$$\frac{C_{var}(T_{cal})}{C_{var}(T_{init})} = \frac{C_r(T_{cal})}{C_r(T_{init})}$$

So if $C_r(T_{cal})$ is a temperature-stable capacitor, i.e. $C_r(T_{cal}) = C_r(T_{init})$ then the value of $R_{final}(T_{cal})$ shows whether the varactor capacitance must be decreased, increased, or left unchanged:

$R_{final}(T_{cal}) = 0$ The varactor capacitance should be left unchanged $R_{final}(T_{cal}) < 0$ The varactor capacitance should be decreased $R_{final}(T_{cal}) > 0$ The varactor capacitance should be increased The receiver system in FIG. 1 is an example of a system that can benefit from this variable capacitance calibration system. There are many other types of systems that can also benefit from use of this method.

If a filter system employs one or more capacitive dividers, a variable-attenuation or/and variable-gain device can be constructed. The signal path gain or/and attenuation can be varied by changing the ratio of the capacitors in one or more dividers. If the filter is also tuned then the series capacitance of each divider may need to remain constant to keep the tuning constant. If this is the case then this calibration method can be employed advantageously.

Figure 11:
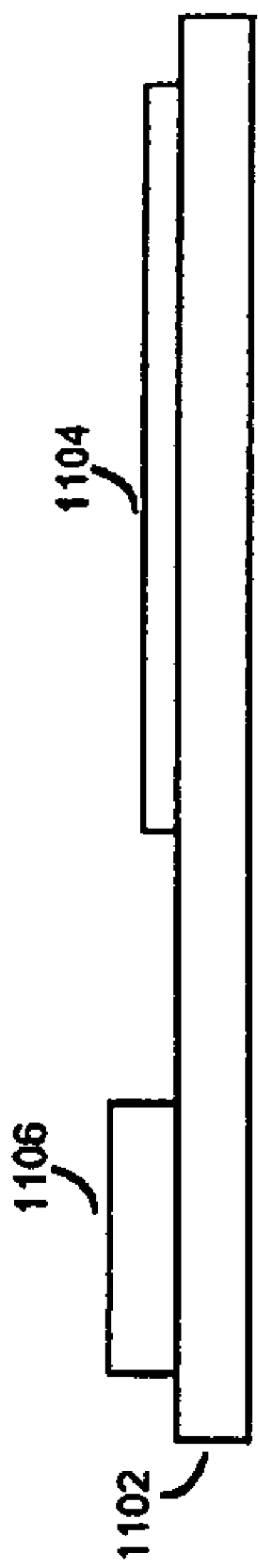
FIG. 11 illustrates a SIP where substrate carries die and inductor.

FIG. 11 illustrates a SIP where substrate 1102 carries die 1104 and inductor 1106.

The invention claimed is:

1. A tuner front end (170) for use with a tuner for tuning a channel from an RF input signal, with calibration to eliminate the need for manual adjustment of the tuner front end, comprising:

a) a multi-mode low noise amplifier that is switchable between a low noise mode and a high linearity mode for amplifying the RF input signal;
b) a first stage tracking filter (140) for filtering the amplified RF input signal comprising an inductor and variable capacitors for setting the filter frequency;
c) an amplifier (142) coupled to the first stage tracking filter (140) and producing an amplified signal; and
d) a test tone generator and tracking filter calibration circuit (183) to apply a calibration signal to the tuner front end and adjust the variable capacitors of the first stage tracking filter (140) to calibrate the response of the first stage tracking filter.

2. The tuner front end of claim 1 further comprising a second stage tracking filter (144) connected to the amplifier (142) output, wherein the second stage tracking filter comprises an inductor and variable capacitors for setting the filter frequency.

3. The tuner front end of claim 2 further comprising in the second stage tracking filter:
a) a Q enhancement circuit (350) and adjustable loss elements (370, 371, and 372) to allow flatness, gain, noise figure and distortion to be traded off.

4. The tuner front end of claim 1 integrated on at least one die wherein the multi-mode low noise amplifier, the amplifier (142), and variable capacitors are on-die and the inductor is off die.

5. The tuner front end of claim 1 wherein the first stage tracking filter has a single inductor setting the filter frequency.

6. The tuner front end of claim 1 wherein the multi-mode low noise amplifier comprises a plurality of reception modes and a calibration mode comprising:
a) a low noise figure mode where the RF input signal is routed through a low noise figure amplifier (120);
b) a high linearity mode where the RF input signal is routed straight to the first stage tracking filter (140);
c) a cable mode where the RF input signal is passed through a broadband input match amplifier (125) and into the tracking filter (130); and
d) a calibration mode where calibration signals (134) from test tone generator and tracking filter calibration circuit 183 are applied to the tracking filter (130).

7. The tuner front end of claim 6 further comprising a demodulator wherein the reception mode is determined by lock information from the demodulator.

8. The tuner front end of claim 6 further comprising a demodulator wherein the reception mode is determined by AGC information from the demodulator.

9. The tuner front end of claim 6 wherein broadband input match amplifier (125) can incorporate variable gain to optimize the tradeoff between noise and linearity in response to varying receive power levels from a signal received from a cable plant.

10. The tuner front end of claim 6 further comprising:
a) a switch S1 (110) connected between the RF input and the tracking filter input;
b) a switch S2 (112) connected between the RF input and ground;
c) a switch S3 (114) and termination impedance (116) connected to the tracking filter input;
wherein during calibration the first stage tracking filter (140) is isolated from the input by disabling the low noise figure amplifier (120) and broadband input match amplifier (125), turning OFF switch S1 (110) and turning ON switch S2 (112) and switch S3 (114) such that the tracking filter is connected to the termination impedance (116) during calibration, whereby the calibration signal is isolated from the RF input.

11. The tuner front end of claim 1, wherein the tracking filters use varactors for variable capacitors and further comprising drift calibration to correct the tracking filter varactors in the tracking filter signal path comprising:
 a) a stable reference capacitor (920);
 b) a reference varactor (910);
 c) means for measuring the stable reference capacitor (920) and the reference varactor (910); and
 d) means for comparing the measurements of the reference capacitor (920) to the reference varactor (910) and using the measurements to correct the tracking filter varactors.

12. The tuner front end of claim 11 wherein the means for measuring and means for comparing comprises:
 a) an oscillator (930) to convert capacitance to frequency;
 b) a calibration counter (932); a reference counter (934);
 c) a control block (936);
 d) a counter (938);
 e) a reference oscillator (940) to drive the reference counter and control block;
 f) an error counter (960) to accumulate drift error and produce a drift calibration value;
 g) a summer (950) to sum the drift calibration value with a varactor tuner word; and
 h) a digital-to-analog converter (942) to drive the reference varactor (910) and the tracking filter varactors.

13. The tuner front end of claim 1 wherein the first stage tracking filter uses high voltage varactors and the tuner further comprises:
 a) a high voltage generator (184); and
 b) a tuning voltage driver (182) coupled to the high voltage generator for supplying tuning voltages to the high voltage varactors.

14. The tuner front end of claim 1 wherein the first stage tracking filter is further comprised of a plurality of variable capacitors wherein the plurality of variable capacitors are high voltage varactors and the plurality of high voltage varactors reside on a single die.

15. A tuner for tuning a channel constructed as a system-in-package (SIP) comprising:
 a) a substrate for carrying components;
 b) at least one die carried on the substrate, the at least one die comprising control circuitry and an amplifier;
 c) at least one tracking filter connected to the amplifier comprising:
 d) at least one variable capacitor for tuning the filter frequency; and
 e) at least one discrete inductor carried on the substrate
 wherein the amplifier is a multi-mode amplifier with a plurality of reception modes comprising a low noise reception mode, a high linearity reception mode, and a calibration mode.

16. The tuner front end of claim 15 further comprising a demodulator wherein the reception mode is determined by lock information from the demodulator.

17. The tuner front end of claim 15 further comprising a demodulator wherein the reception mode is determined by AGC information from the demodulator.

18. The tuner of claim 15 further comprising a test tone generator and tracking filter calibration circuit to apply a calibration signal to the tracking filter and adjust the variable capacitor to center the tracking filter frequency on the channel.

19. The tuner of claim 18 further comprising drift calibration circuitry wherein the at least one variable capacitor is calibrated to a stable reference capacitor using a method comprising the steps of:
 a) performing an initial calibration sequence wherein the ratio between the variable
 b) capacitor and reference capacitance is measured and the ratio is stored; and
 c) performing an update calibration sequence wherein the ratio between the variable capacitor and reference capacitance is re-measured and if this ratio is different than the stored ratio value then directing the variable capacitor tuning to change in a compensating direction.

20. The tuner of claim 19 where the drift calibration circuitry comprises an oscillator to convert capacitance into frequency for relative capacitance measurements.

21. The tuner of claim 18 further comprising a drift calibration system comprising:
 a) a reference capacitor (920) that is stable; and
 b) a reference varactor (910);
 c) means for measuring the ratio of capacitance of the reference varactor to the reference capacitor, and means for tuning the voltages of varactors in the tuner according to the ratio measurement.

22. A tuner with selectable front end comprising:
 a) an RF input;
 b) a multi-mode amplifier (160) that is selectable to provide a low noise reception mode or high linearity reception mode for the RF input, or a calibration mode;
 c) a tracking filter (130) coupled to the multi-mode amplifier;
 d) the output of the tracking filter (130) is coupled to a second amplifier (185); and
 e) a downconverter (189) coupled to the output of the second amplifier (185);
 whereby a channel is tuned from the RF input.

23. The tuner front end of claim 22 further comprising a demodulator wherein the reception mode is determined by lock and AGC information from the demodulator.

24. The tuner of claim 22 further comprising:
 a) a plurality of tracking filters (130), wherein each tracking filter (130) filters a different band of frequencies and has a common input;
 b) a selector switch (188) to select a tuner front end output for coupling to the downconverter; and
 c) test tone generator and tracking filter calibration circuit (183) for applying a calibration signal to the tracking filters.

25. The tuner of claim 22 further comprising a test tone generator and tracking filter calibration circuit to apply a calibration signal to the tracking filter and adjust the variable capacitor to center the filter frequency on the channel.

26. The tuner of claim 25 further comprising drift calibration circuitry wherein the at least one variable capacitor is calibrated to a stable reference capacitor using a method comprising the steps of:
 a) performing an initial calibration sequence wherein the ratio between the variable capacitor and reference capacitance is measured and the ratio is stored; and
 b) performing an update calibration sequence wherein the ratio between the variable capacitor and reference capacitance is re-measured and if this ratio is different than the previously stored ratio value then directing the variable capacitor tuning to change in a compensating direction.

27. The tuner of claim 25 further comprising an image rejection mixer coupled to the tracking filter to provide image rejection.

28. The tuner of claim 25 wherein the variable capacitors are high voltage varactors and the tuner further comprises on a die:
   a) a high voltage generator; and
   b) a tuning voltage driver for supplying tuning voltages to the high voltage varactors.

29. The tuner of claim 25 wherein at least two variable capacitors are high voltage varactors and the high voltage varactors are fabricated on a common die.

30. The tuner of claim 25 wherein the at least one variable capacitor is a high voltage varactor and the substrate carries the high voltage varactor.

31. The tuner of claim 26 where the drift calibration circuitry comprises an oscillator to convert capacitance into frequency for relative capacitance measurements.

* * * * *